(12) United States Patent
Wang et al.

(10) Patent No.: US 9,468,095 B1
(45) Date of Patent: Oct. 11, 2016

(54) MANUFACTURING METHOD OF MULTILAYER WIRING AND MULTILAYER WIRING STRUCTURE

(71) Applicant: Industrial Technology Research Institute, Hsinchu (TW)

(72) Inventors: Yu-Ming Wang, Taichung (TW); Sheng-Yu Lin, Miaoli County (TW); Kai-Jiun Wang, Changhua County (TW); Wei-Yuan Chen, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/981,878

(22) Filed: Dec. 28, 2015

(30) Foreign Application Priority Data

Oct. 28, 2015 (TW) .............................. 104135354 A

(51) Int. Cl.
| | |
|---|---|
| *H05K 1/09* | (2006.01) |
| *H05K 1/03* | (2006.01) |
| *H05K 1/00* | (2006.01) |
| *C23C 24/00* | (2006.01) |
| *H05K 1/02* | (2006.01) |
| *H05K 1/11* | (2006.01) |

(Continued)

(52) U.S. Cl.
CPC ............ *H05K 1/0298* (2013.01); *H05K 1/115* (2013.01); *H05K 3/0044* (2013.01); *H05K 3/422* (2013.01)

(58) Field of Classification Search
CPC .. H05K 1/0298; H05K 1/115; H05K 3/0044; H05K 3/422
USPC ................................... 174/255–258; 427/97.5
See application file for complete search history.

(56) References Cited

U.S. PATENT DOCUMENTS

| | | |
|---|---|---|
| 6,471,805 B1 | 10/2002 | Thaler et al. |
| 7,252,699 B2 | 8/2007 | Perry et al. |

(Continued)

FOREIGN PATENT DOCUMENTS

| | | |
|---|---|---|
| CN | 103635035 | 3/2014 |
| TW | 201426437 | 7/2014 |

(Continued)

OTHER PUBLICATIONS

Chun-Chieh Tseng, et al., "Synthesis of vinyl acetate/Pd nanocomposites as activator ink for ink-jet printing technology and electroless copper plating," Journal of the Taiwan Institute of Chemical Engineers, vol. 42, Issue 6, Nov. 2011, pp. 989-995.

(Continued)

*Primary Examiner* — Sherman Ng
(74) *Attorney, Agent, or Firm* — Jianq Chyun IP Office

(57) ABSTRACT

A manufacturing method of multilayer wiring is provided, wherein a multilayer wiring structure including a wiring layer and a conductive via is formed on a substrate. The wiring layer is formed by forming a patterned colloidal layer having a first catalyzer on the substrate, activating the first catalyzer, and forming a conductive layer on a surface of the patterned colloidal layer. The conductive via is formed by forming an insulation colloidal layer containing a second catalyzer on the substrate and the conductive layer and forming at least one opening in the colloidal insulation layer by laser to expose the conductive layer and activate a portion of the second catalyzer. Electroless plating is performed on the activated second catalyzer to form the conductive via in the opening. An interface is between the patterned colloidal layer and the conductive layer in the multilayer wiring structure.

39 Claims, 7 Drawing Sheets

(51) Int. Cl.
*H05K 3/00* (2006.01)
*H05K 3/42* (2006.01)

(56) References Cited

U.S. PATENT DOCUMENTS

| | | | |
|---|---|---|---|
| 8,187,664 | B2 | 5/2012 | Matsumoto et al. |
| 8,510,941 | B2 | 8/2013 | Sidhu |
| 8,637,776 | B2 | 1/2014 | Hwang et al. |
| 8,929,092 | B2 | 1/2015 | Yoshioka et al. |
| 8,963,019 | B2 | 2/2015 | Yu et al. |
| 8,987,603 | B2 | 3/2015 | Shirai et al. |
| 2002/0076539 | A1* | 6/2002 | Nakamura ............ C08L 63/00 428/209 |
| 2009/0277672 | A1* | 11/2009 | Matsumoto ........... C23C 18/30 174/257 |
| 2010/0078209 | A1* | 4/2010 | Inoue .................... H05K 3/125 174/261 |
| 2010/0263917 | A1 | 10/2010 | Heo et al. |

FOREIGN PATENT DOCUMENTS

| | | |
|---|---|---|
| TW | I466604 | 12/2014 |
| TW | 201519724 | 5/2015 |
| TW | I489342 | 6/2015 |

OTHER PUBLICATIONS

Henry J. Gysling, "Nanoinks in inkjet metallization—Evolution of simple additive-type metal patterning," Current Opinion in Colloid & Interface Science, vol. 19, No. 2, Apr. 2014, pp. 155-162.

Pirmin C. Hidber, et al., "Microcontact Printing of Palladium Colloids: Micron-Scale Patterning by Electroless Deposition of Copper," Langmuir, vol. 12, No. 5, Mar. 1996, pp. 1375-1380.

Andreas Möbius, et al., "Plasma-printing and galvanic metallization hand in hand—A new technology for the cost-efficient manufacture of flexible printed circuits," Electrochimica Acta, vol. 54, Issue 9, Mar. 30, 2009, pp. 2473-2477.

Wei-Ping Dow, et al., "A novel copper electroplating formula for laser-drilled micro via and through hole filling," Circuit World, vol. 30, Issue 3, Sep. 1, 2004, pp. 33-36.

Dong-Hyun Baek, et al., "A method for stable electrical connection of a multi-channeled polyimide electrode with PCB," 34th Annual International Conference of the IEEE EMBS, Aug. 28-Sep. 1, 2012, pp. 4482-4484.

Yu-Ming Wang, et al., "Structure of Conductive Lines and Method of Manufacturing the Same," Unpublished Taiwan application No. 103141353, Filed on Nov. 28, 2014.

Meng-Chi Huang, et al., "Insulating Colloidal Material and Multilayer Circuit Structure," Unpublished Taiwan application No. 104135497, Filed on Oct. 28, 2015.

\* cited by examiner

US 9,468,095 B1

MANUFACTURING METHOD OF MULTILAYER WIRING AND MULTILAYER WIRING STRUCTURE

CROSS-REFERENCE TO RELATED APPLICATION

This application claims the priority benefit of Taiwan application no. 104135354, filed on Oct. 28, 2015. The entirety of the above-mentioned patent application is hereby incorporated by reference herein and made a part of this specification.

TECHNICAL FIELD

The disclosure relates to a manufacturing method of multilayer wiring and a multilayer wiring structure.

BACKGROUND

According to a number of market research reports, printed electronic products have large market potential in the future, and the products are common in the continuous miniaturization of their volumes. To satisfy the design requirements for lighter, smaller, or thinner products, the size of each part in the products is strictly restricted. For instance, the line width of conductive wire used in the printed electronic products is reduced from hundreds of nanometers to dozens of nanometers, which leads to a stalemate between manufacturing capabilities and costs. Due to the enhancement of functionality of electronic devices, wiring density has been continuously increased, and more space is thus required, which brings about the need for double-layer or multilayer printed circuit boards.

However, the existing multilayer printed circuit boards must be made by performing not only the printing process but also the lithographic process, so as to form conductive vias and conductive layers. The lithographic process inevitably raises three major issues: environmental pollution, low manufacturing yield, and high manufacturing costs. Specifically, chemicals are required in the process of forming the double-layer/multilayer printed circuit board, such as a chemical plating solution, an electroplating solution, photoresist, a developer, and an etching solution, which often results in significant energy consumption and severe pollution. Besides, in the lithographic process, fine conductive lines are often formed by a metal etching technology. Thereby, undercuts may be generated at the bottom of the fine conductive lines during etching, the section of the fine conductive lines is shaped as an inverted trapezoid, and the yield of the resultant products is reduced. Moreover, in through-via technology, a polyimide (PI) substrate is often used, and therefore the PI substrate should be coated with a black glue (carbon glue), so as to be used as a conductive substrate. Last but not least, the existing electronic products are often characterized by reduced price, and thus the high manufacturing costs of the lithographic process are unaffordable.

From another perspective, the integration of the printing process and the lithographic process is still immature. For example, after the printing process is performed, the product obtained may contain a polymer material or other mixtures, which is likely to affect the performance of the equipment employed for performing the lithographic process; in addition, the difficulty in matching the polymer material with the photoresist cannot be easily overcome.

SUMMARY

The disclosure provides a manufacturing method of multilayer wiring. According to the manufacturing method, a substrate is provided, a wiring layer is formed on the substrate, and a conductive via is formed on the substrate. In a method of forming the wiring layer, a patterned colloidal layer is formed on the substrate. The patterned colloidal layer includes 60-90 wt % of a polymer material and 10-40 wt % of a first catalyzer. The first catalyzer is activated, and the activated first catalyzer reacts with a chemical plating solution for forming a conductive layer on a surface of the patterned colloidal layer. In a method of forming the conductive via, an insulation colloidal layer including an insulation colloid and a second catalyzer is formed on the substrate and the conductive layer, and at least one opening is formed in the insulation colloidal layer by laser to expose the conductive layer and activate a portion of the second catalyzer. An electroless plating process is performed on the activated second catalyzer to form the conductive via in the at least one opening. Here, the second catalyzer accounts for 0.1-10 wt % of the insulation colloidal layer.

The disclosure further provides a multilayer wiring structure including a substrate, a wiring layer located on the substrate, an insulation colloidal layer covering the substrate and the wiring layer, and at least one conductive via. The wiring layer includes a patterned colloidal layer and a conductive layer. An intersection is between the patterned colloidal layer and the conductive layer, and the patterned colloidal layer includes 60-90 wt % of a polymer material and 10-40 wt % of a first catalyzer. The insulation colloidal layer includes an insulation colloid and a second catalyzer, and the second catalyzer accounts for 0.1-10 wt % of the insulation colloidal layer. The conductive via is formed in the insulation colloidal layer and electrically connected to the conductive layer.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate embodiments and, together with the description, serve to explain the principles of the disclosure.

DETAILED DESCRIPTION OF DISCLOSED EMBODIMENTS

Figure 1:
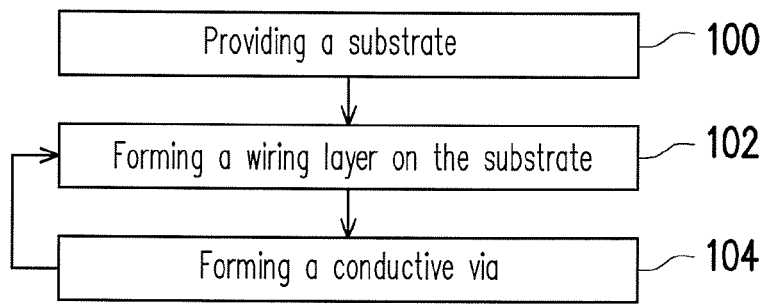
FIG. 1 illustrates steps in a manufacturing process of multilayer wiring according to an embodiment of the disclosure.

FIG. 1 illustrates steps in a manufacturing process of multilayer wiring according to an embodiment of the disclosure. FIG. 2A through FIG. 2G are schematic cross-sectional views showing the manufacturing process depicted in FIG. 1.

Figure 2A:
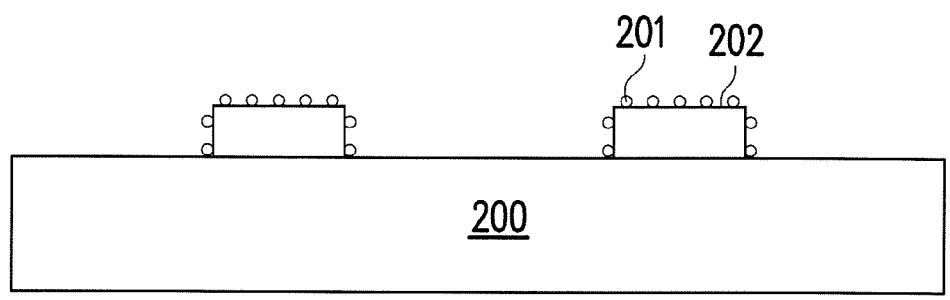
FIG. 2A through FIG. 2G are schematic cross-sectional views showing the manufacturing process depicted in FIG. 1.

With reference to FIG. 1 and FIG. 2A, in step 100, a substrate 200 is provided. The substrate 200 includes but is not limited to a rigid substrate or a flexible substrate and may be made of glass, sapphire, silicon, silicon germanium, silicon carbide, gallium nitride, a polymer material (e.g., polyethylene terephthalate (PET), bismaleimide-triazine (BT) resin, polyidime, or polyamide), or a combination thereof.

In step S102, a wiring layer is formed on the substrate. With reference to FIG. 2A, a patterned colloidal layer 202 is formed on the substrate 200, and the patterned colloidal layer 202 may be formed through printing, such as screen printing, flexographic printing, relief printing, gravure offset printing, or inkjet printing, which should however not be construed as a limitation to the disclosure. For instance, the patterned colloidal layer 202 formed through gravure offset printing may have a line width less than or equal to 30 micrometers and a thickness less than or equal to 3 micrometers. Besides, a surface tension of the patterned colloidal layer 202 is less than or equal to 45 mN/m, so as to prevent the printed patterned from being distorted. Specifically, the surface energy of a transfer printing medium is low; therefore, if the surface tension of the patterned colloidal layer 202 is not small enough, the patterned colloidal layer 202 may shrink in size down to liquid droplets on the surface of the transfer printing medium, such that the transfer printed patterns may be distorted, or the transfer printed wiring may be disconnected. In the present embodiment, the patterned colloidal layer 202 includes 60-90 wt % of a polymer material and 10-40 wt % of a first catalyzer; given that a fine line with the width of 1-3 μm is to be formed, the patterned colloidal layer 202 preferably includes at most 20 wt % of the first catalyzer. In general, the smaller the line width of the to-be-printed patterned colloidal layer 202, the less the first catalyzer included by the patterned colloidal layer 202. However, in order not to reduce the growth speed of the coating film in the subsequent chemical plating process, the patterned colloidal layer 202 preferably includes at least 10 wt % of the first catalyzer, so as not to add the reaction time in the chemical plating process.

The first catalyzer provided in the present embodiment is an ion compound, metal particles, or a mixture thereof, for instance. The metal particles may be copper particles, silver particles, palladium particles, etc., preferably a nano-metal particle. The ion compound, for instance, includes $CuCl_2$, $Cu(NO_3)_2$, $CuSO_4$, $Cu(OAc)_2$, $AgCl$, $AgNO_3$, $Ag_2SO_4$, $Ag(OAc)$, $Pd(OAc)$, $PdCl_2$, $Pd(NO_3)_2$, $PdSO_4$, $Pd(OAc)_2$, $FeCl_2$, $Fe(NO_3)_2$, $FeSO_4$, or $[Fe_3O(OAc)_6(H_2O)_3]OAc$. The polymer material of the patterned colloidal layer 202 includes an acrylic material, epoxy resin, phenol resin, or a mixture thereof, for instance.

With reference to FIG. 2A, the first catalyzer may be activated by irradiating ultraviolet (UV) light, heating, or performing a plasma treatment, such that the activated first catalyzer 201 is deposited on the surface of the patterned colloidal layer 202. According the way to activate the first catalyzer or the properties of the first catalyzer, other additives may be added to the patterned colloidal layer 202. For instance, when the UV light is irradiated to activate the first catalyzer, a photo-initiator reagent may be firstly added to the patterned colloidal layer 202.

Figure 2B:
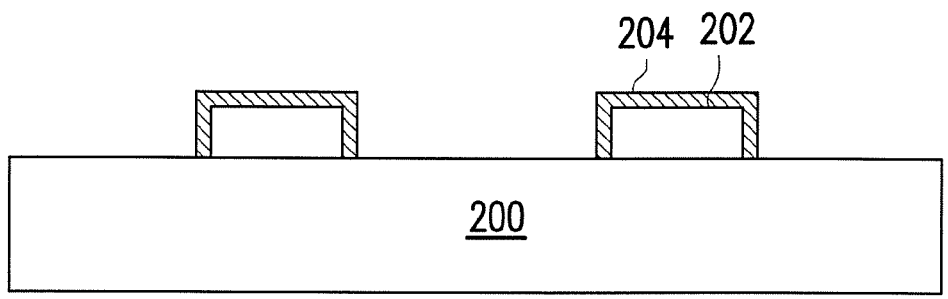

With reference to FIG. 2B, the activated first catalyzer 201 may react with a chemical plating solution, so as to grow a first dense conductive layer 204 on the surface of the patterned colloidal layer 202; thereby, the wiring layer is formed. A method of growing the first conductive layer 204 includes chemical plating.

Figure 2C:
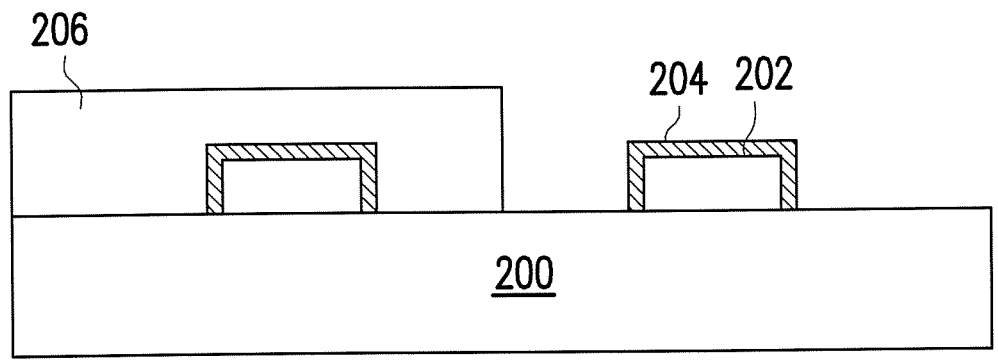

A step 104 for forming a conductive via is performed. With reference to FIG. 2C, an insulation colloidal layer 206 is formed on the substrate 200 and the first conductive layer 204. Here, a method of forming the insulation colloidal layer 206 includes coating (including but not limited to slot-die coating), spray coating, or blade coating. The insulation colloidal layer 206 includes an insulation colloid and a second catalyzer, and the second catalyzer accounts for 0.1-10 wt % of the insulation colloidal layer 206. The insulation colloid is, for instance, polyphenylene oxide (PPO), BT, cyclo olefin copolymer (COC), liquid crystal polymer (LCP), or epoxy resin. The insulation colloidal layer 206 may further include a color pigment, e.g., an inorganic pigment or an organic pigment. The inorganic pigment may be carbon black or titanium white, for instance; the organic pigment may be azo pigment (—N=N—), copper phthalocyanine blue ($C_{32}H_{16}N_8Cu$), or phthalocyanine green ($C_{32}HCl_{15}N_8Cu$), for instance.

In the present embodiment, the second catalyzer is, for instance, an organometallic compound, an ion compound, a metal chelate compound, or a semiconductor material with a band gap greater than or equal to 3 eV. Said semiconductor material is, for instance, gallium nitride (GaN), zinc sulfide (ZnS), silicon carbide (SiC), zinc oxide (ZnO), titanium dioxide ($TiO_2$), or aluminum gallium nitride (AlGaN). Alternatively, the semiconductor material may also have a band gap greater than or equal to 4 eV, such as aluminum nitride (AlN), aluminum oxide ($Al_2O_3$), boron nitride (BN), silicon nitride ($Si_3N_4$), and silicon dioxide ($SiO_2$). Here, one semiconductor material may be employed, or two or more semiconductor materials may be employed together.

A structure of the organometallic compound includes R-M-R' or R-M-X; here, R and R' individually represent an alkyl group, aromatic hydrocarbon, cycloalkane, haloalkane, a heterocyclic ring, or carboxylic acid; M is one selected from the group consisting of silver, palladium, copper, gold, tin, iron, and combinations thereof; and X is a halogen compound or an amine. A carbon number of at least one of R and R' in the structure of the organometallic compound is preferably greater than or equal to 3. When M is surrounded by the organic functional groups R and R', the electrons cannot move at will, and thus the second catalyzer has no conductivity. That is, before the subsequent activation process is performed, the second catalyzer remains insulating.

The metal chelate compound is made by chelating a metal with a chelating agent, for instance, and the chelating agent is ammonium pyrrolidine dithiocarbamate (APDC), ehytlenediaminetetraacetic acid (EDTA), N,N'-bis(carboxymethyl) nitrilotriacetate acid (NTA), or diethylenetriamine pentaacetic acid (DTPA). Note that one or more chelating agents can be used. The metal in the metal chelate compound is one selected from the group consisting of silver, palladium, copper, gold, tin, aluminum, nickel, iron, and combinations thereof.

The type of the chelating agent and the type of the metal are not limited herein. When the metal is surrounded by the chelating agent, the electrons cannot move at will, and thus the second catalyzer has no conductivity. That is, before the subsequent activation process is performed, the second catalyzer remains insulating.

If the second catalyzer is the ion compound, the ion compound may be $CuCl_2$, $Cu(NO_3)_2$, $CuSO_4$, $Cu(OAc)_2$, AgCl, $AgNO_3$, $Ag_2SO_4$, Ag(OAc), Pd(OAc), $PdCl_2$, $Pd(NO_3)_2$, $PdSO_4$, $Pd(OAc)_2$, $FeCl_2$, $Fe(NO_3)_2$, $FeSO_4$, or $[Fe_3O(OAc)_6(H_2O)_3]OAc$.

Figure 2D:
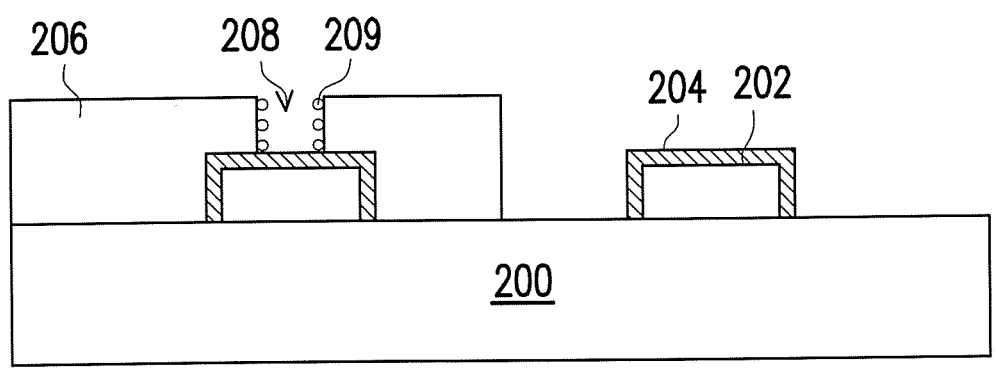

With reference to FIG. 2D, at least one opening 208 is formed in the insulation colloidal layer 206 by laser to expose the first conductive layer 204 and activate a portion of the second catalyzer in the insulation colloidal layer 206, such that the activated second catalyzer 209 is deposited on sidewalls of the opening 208. The laser may be high-energy laser (e.g., YAG laser) or argon laser, and a wavelength of the laser may be in a range from 200 nm to 1100 nm, for instance, which should not be construed as a limitation to the disclosure.

Figure 2E:
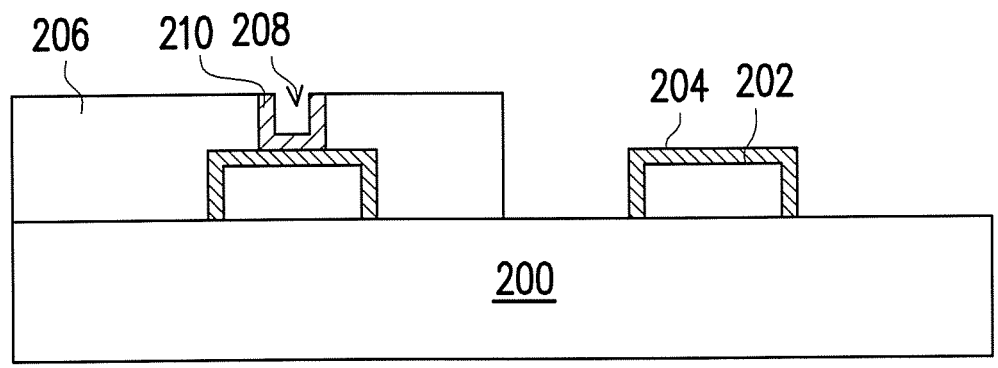

With reference to FIG. 2E, an electroless plating process is performed on the activated second catalyzer 209, so as to form the conductive via 210 in the opening 208. The conductive via 210 may not completely fill the opening 208, as shown in FIG. 2E, which should however not be construed as a limitation to the disclosure. It is likely to completely fill the opening 208 with the conductive via 210 through adjusting manufacturing parameters. The depth, the width, and the shape of the opening 208 may be changed according to the product requirements, and the resultant conductive via 210 may be a single via shown in FIG. 2E or a dual damascene structure (not shown) constituted by a trench and a via.

Figure 2F:
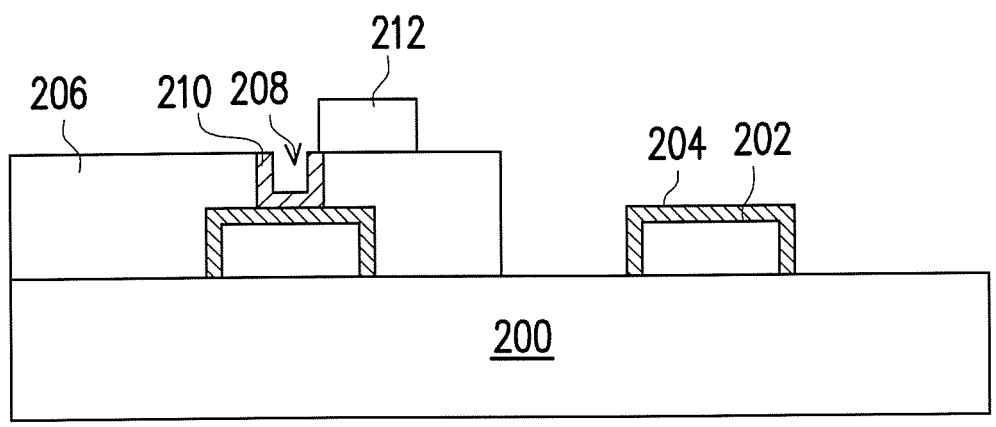
Figure 2G:
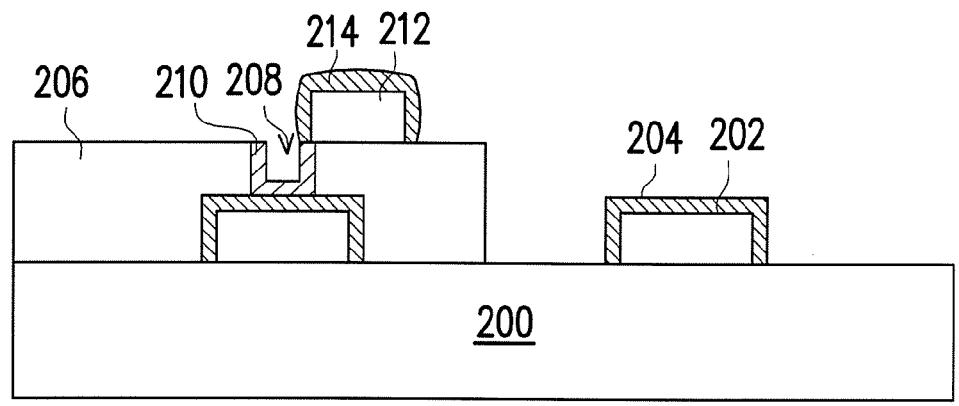

In another aspect, as shown in FIG. 2F to FIG. 2G, multilayer wiring with multiple wiring layers may be formed by repeating said step 102 of forming the wiring layer and said step 104 of forming the conductive wire.

With reference to FIG. 2F, another patterned colloidal layer 212 is formed on the insulation colloidal layer 206 on the substrate 200, and the method of forming the patterned colloidal layer 212 and the material of the patterned colloidal layer 212 may be the same as the method of forming the patterned colloidal layer 202 and the material of the patterned colloidal layer 202. The location of the patterned colloidal layer 212 is adjustable as long as the subsequently formed wiring and the conductive via 210 are electrically connected. Preferably, the sidewall of the patterned colloidal layer 212 may be coplanar with the sidewall of the conductive via 210, so as to increase the yield of the multilayer wiring.

With reference to FIG. 2G, the first catalyzer in the patterned colloidal layer 212 is activated, and a second conductive layer 214 is formed through chemical plating. The upper second conductive layer 214 and the lower first conductive layer 204 can thus be connected through the conductive via 210, and thereby the multilayer wiring can be formed.

Figure 3:
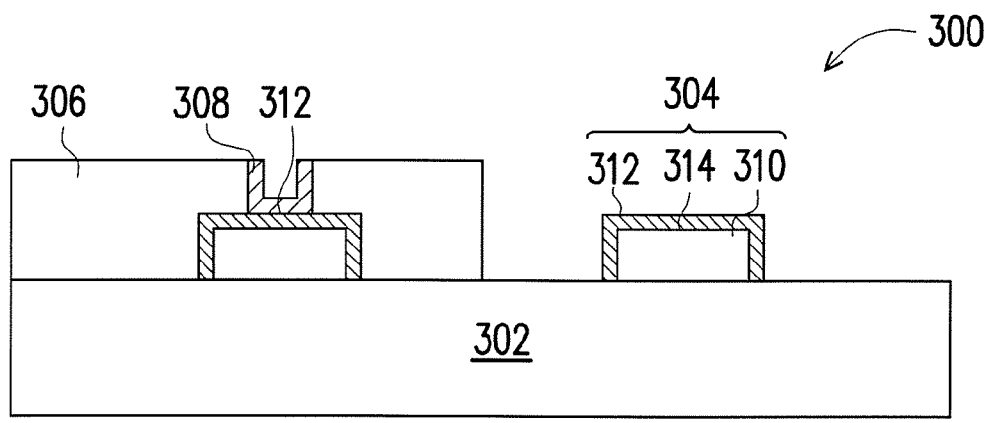
FIG. 3 is a schematic cross-sectional view illustrating a multilayer wiring structure according to an embodiment of the disclosure.

FIG. 3 is a schematic cross-sectional view illustrating a multilayer wiring structure according to an embodiment of the disclosure.

With reference to FIG. 3, the multilayer wiring structure 300 provided in the present embodiment includes a substrate 302, a wiring layer 304 located on the substrate 302, an insulation colloidal layer 306 covering the substrate 302 and the wiring layer 304, and at least one conductive via 308. The wiring layer 304 includes a patterned colloidal layer 310 and a conductive layer 312. An intersection 314 is between the patterned colloidal layer 310 and the conductive layer 312, and the intersection 314 is substantially parallel to a surface of the substrate 302. The conductive via 308 is formed in the insulation colloidal layer 306 and electrically connected to the conductive layer 312. The materials, the manufacturing steps, and the dimensions of the substrate 302, the insulation colloidal layer 306, the conductive layer 312, and the conductive via 308 may be selected from those provided in the previous embodiment and thus are not further explained hereinafter.

Several experiments are conducted to verify the effects that can be achieved as provided in the disclosure, whereas the scope of protection is not limited to those described hereinafter.

Experimental Example 1

In experimental example 1, the wiring layer is formed through gravure offset printing. A patterned colloidal layer is transferred on a surface of a PI substrate through gravure offset printing, and the patterned colloidal layer is composed of 1 g of polyacrylate-epoxy resin (model no. 395, purchased from ChemBridge), 0.1 g of phenol (model no. 3706, purchased from ChemBridge), 0.3 g of silver acetate (purchased from SIGMA), and 0.1 g of 20 nm $TiO_2$. Adding a small amount of $TiO_2$ allows the surface tension of the patterned colloidal layer to be changed from 23.8 mN/m to 25 mN/m, and the time required for metal deposition can then be shortened.

Figure 4:
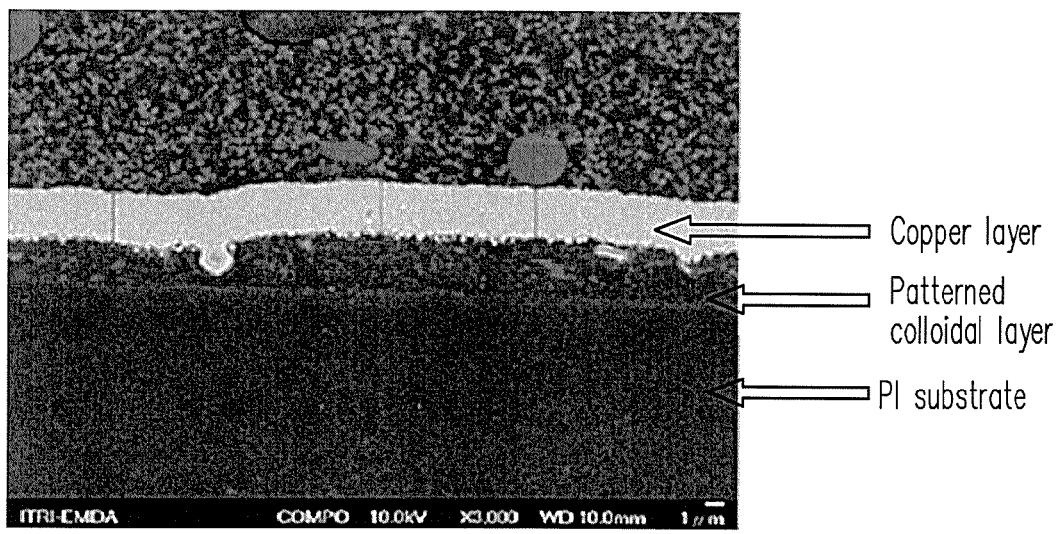
FIG. 4 is a cross-sectional SEM diagram of a wiring layer according to an experimental example 1.
Figure 5:
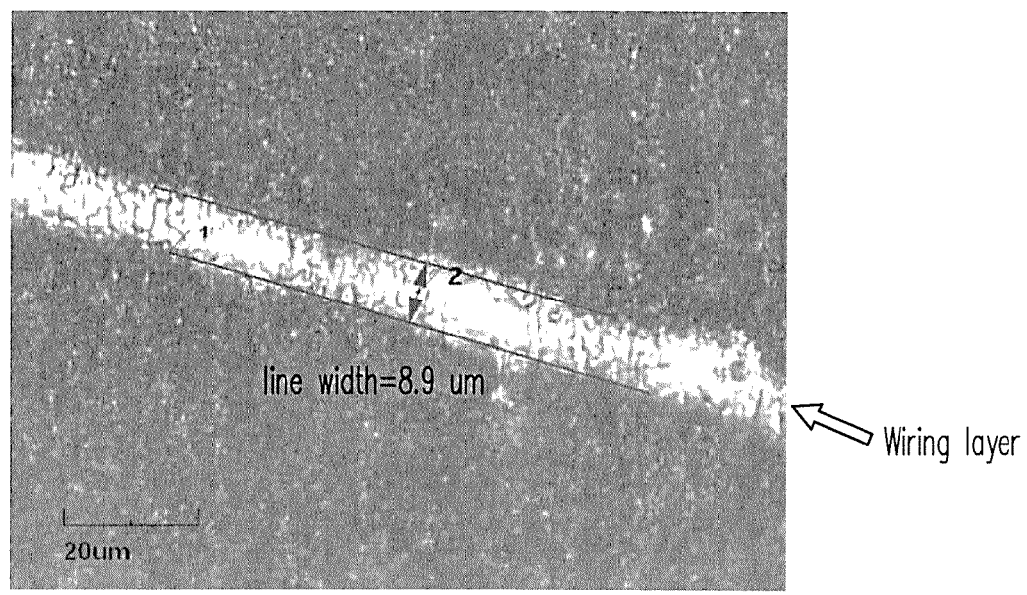
FIG. 5 is a top SEM diagram of a wiring layer according to the experimental example 1.

The first catalyzer in the patterned colloidal layer is activated after being irradiated by heated UV light for five minutes and baked for five minutes, and the first catalyzer herein refers to silver acetate. A copper layer with high density is grown on a surface of the patterned colloidal layer through chemical copper plating. A chemical plating solution applied in the chemical copper plating includes 14.9 g/L of copper sulfate, 35.1 g/L of EDTA, and 10 mL/L of formaldehyde, and the duration of chemical copper plating is around 50 minutes. It can be learned from observing the SEM diagram that an apparent intersection (as exemplarily shown in FIG. 4) is between the patterned colloidal layer and the copper layer in the resultant wiring layer, and the line width of the wiring layer is 8.9 micrometers (as exemplarily shown in FIG. 5).

Experimental Example 2

The patterned colloidal layer with the line with of 3 micrometers is printed on a surface of a polyethylene terephthalate (PET) substrate, and the patterned colloidal layer is composed of 1 g of polyacrylate-epoxy resin (model no. 395, purchased from ChemBridge), 0.1 g of phenol (model no. 3760, purchased from ChemBridge), 0.5 g of silver acetate (purchased from SIGMA), and 0.21 g of BYK378 (a pharmaceutical model number) acting as a surface tension adjusting agent, so as to control the surface tension of the patterned colloidal layer to be 37.6 mN/m.

Figure 6:
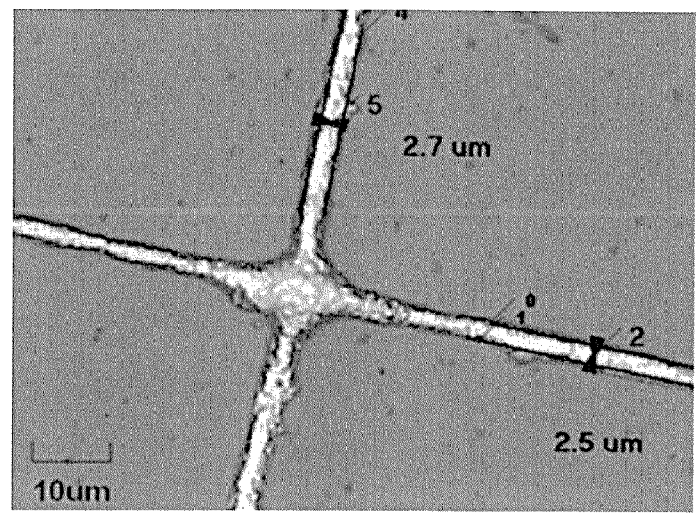
FIG. 6 is a top SEM diagram of a conductive layer according to an experimental example 2.

A UV light with 1.84 $J/cm^2$ of energy and 365 nm of wavelength is applied to activate the first catalyzer in the patterned colloidal layer, and the substrate is then submerged into the chemical plating solution (same as that employed in the experimental example 1) for approximately 30 minutes, so as to form the wiring layer. It can be learned from observing the SEM diagram that the line width of the resultant wiring layer is at most 3 micrometers (as exemplarily shown in FIG. 6). Besides, the actual sheet resistance is about 5Ω/□, and the transmission of the substrate is about 87.8%.

Experimental Example 3

The wiring layer is formed by carrying out the steps described in the experimental example 1, and the PI substrate and the copper layer are coated with insulation colloid. Here, the insulation colloid is prepared by dissolving 0.5 wt % of CuCl$_2$ into methanol and mixing the mixture of CuCl$_2$ and methanol with 50 wt % of epoxy resin. 1 wt % of pigment (carbon black) is also added to the resultant mixture. The mixture is then heated and cured, so as to form the insulation colloidal layer with the thickness of 100 m.

Figure 7:
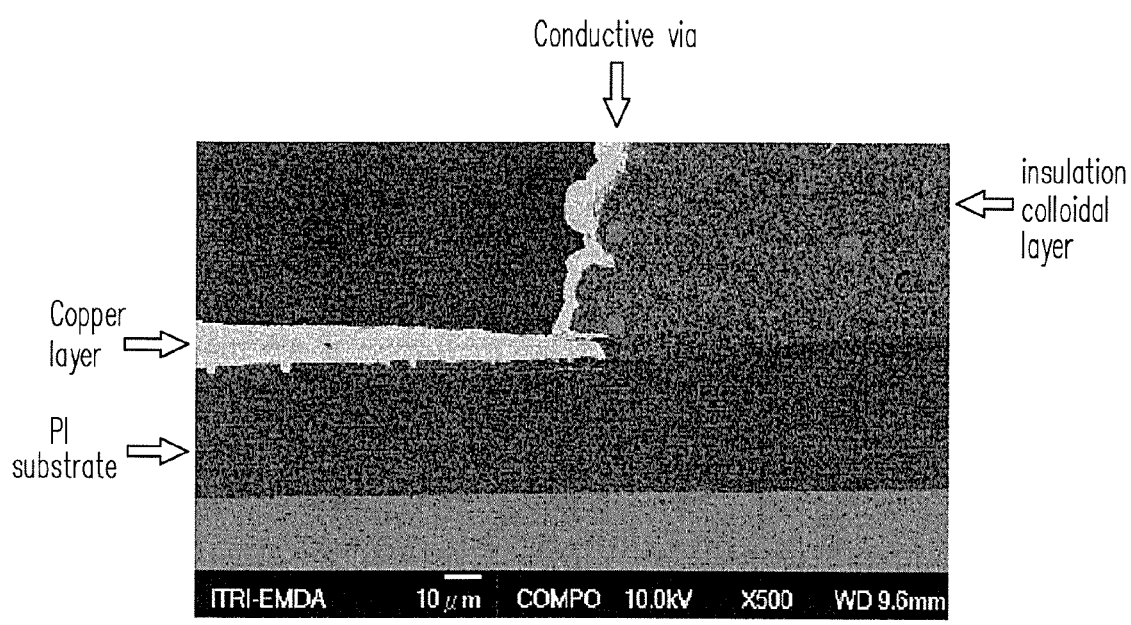
FIG. 7 is a cross-sectional SEM diagram of a conductive via according to an experimental example 3.

An opening is formed through burning the insulation colloidal layer with use of argon laser (with 1064 nm of wavelength) as the laser source, the copper layer is exposed, and a portion of the second catalyzer (i.e., CuCl$_2$) in the insulation layer is activated. An electroless copper plating process is then performed with use of the activated second catalyzer, so as to form the conductive via in the opening. It can be learned from observing the SEM diagram that the conductive via is apparently connected to the copper layer (as exemplarily shown in FIG. 7).

Experimental Example 4

Figure 8:
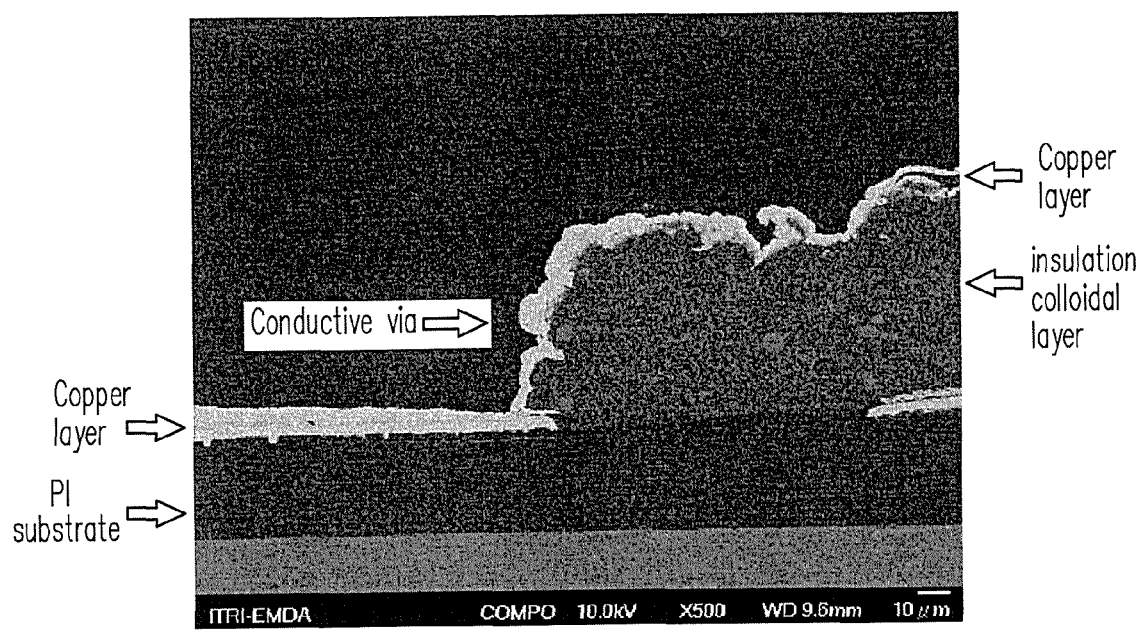
FIG. 8 is a cross-sectional SEM diagram of multilayer wiring according to an experimental example 4.

The wiring layer and the conductive via are formed by carrying out the steps described in the experimental example 3, and the steps provided in the experimental example 1 are repeated. It can be learned from observing the SEM diagram that the conductive via is apparently connected to the upper copper layer (as exemplarily shown in FIG. 8), and the measured resistance between the first (lower) copper layer and the second (upper) copper layer through the conductive via is 0.007Ω.

To sum up, according to the manufacturing method of multilayer wiring provided herein, the patterned colloidal layer having the first catalyzer is formed on the substrate. After the first catalyzer is activated, the conductive layer with the high density can be directly grown on the patterned colloidal layer through chemical plating; therefore, even though the wiring slightly shrinks, the conductive layer can have favorable conductivity, the undercuts often generated in the conventional lithographic process are not produced herein, and the yield can be improved. Moreover, in the manufacturing method of multilayer wiring, at least one small opening may be formed in the insulation colloidal layer by laser. The insulation colloidal layer has 0.1-10 wt % of the second catalyzer, such that the dielectric constant $D_k$ and the dielectric loss $D_f$ of the insulation colloidal layer remain the same as those of the insulation material. Hence, during the manufacture of the wiring layers, the insulation colloidal layer can act as the insulation layer in multiple wiring layers; through laser drilling and electroless plating, conductive lines and small conductive vias can be formed. As a result, the manufacturing method of multilayer wiring provided herein is conducted without performing the lithographic process, so as to resolve issues of environmental protection, reduced manufacturing yield, high costs, and integration of processes which are caused by the lithographic process. From another perspective, no high-temperature process is required by the manufacturing method of multilayer wiring provided herein; accordingly, compared to the conventional manufacturing method of multilayer wiring, the manufacturing method of multilayer wiring provided herein can prevent the expansion and contraction issue arisen from heat.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A manufacturing method of multilayer wiring, the manufacturing method comprising:
    providing a substrate;
    forming a wiring layer on the substrate, comprising:
        forming a patterned colloidal layer on the substrate, wherein the patterned colloidal layer comprises 60-90 wt % of a polymer material and 10-40 wt % of a first catalyzer;
        activating the first catalyzer; and
        reacting the activated first catalyzer with a chemical plating solution for forming a conductive layer on a surface of the patterned colloidal layer; and
    forming a conductive via, comprising:
        forming an insulation colloidal layer on the substrate and the conductive layer, the insulation colloidal layer comprising an insulation colloid and a second catalyzer, the second catalyzer accounting for 0.1-10 wt % of the insulation colloidal layer;
        forming at least one opening in the insulation colloidal layer by laser to expose the conductive layer and activate a portion of the second catalyzer; and
        performing an electroless plating process on the activated second catalyzer, so as to form the conductive via in the at least one opening.

2. The manufacturing method of claim 1, wherein a method of activating the first catalyzer comprises irradiating ultraviolet light, heating, or performing a plasma treatment.

3. The manufacturing method of claim 1, wherein a surface tension of the patterned colloidal layer is less than or equal to 45 mN/m.

4. The manufacturing method of claim 1, wherein a method of forming the patterned colloidal layer comprises gravure offset printing, screen printing, flexographic printing, relief printing, or inkjet printing.

5. The manufacturing method of claim 1, wherein a line width of the patterned colloidal layer is less than or equal to 30 micrometers.

6. The manufacturing method of claim 1, wherein a thickness of the patterned colloidal layer is less than or equal to 3 micrometers.

7. The manufacturing method of claim 1, wherein the polymer material comprises an acrylic material, epoxy resin, phenol resin, or a mixture thereof.

8. The manufacturing method of claim 1, wherein the first catalyzer comprises an ion compound, a metal particle, or a mixture thereof.

9. The manufacturing method of claim 8, wherein the metal particle comprises a copper particle, a silver particle, or a palladium particle.

10. The manufacturing method of claim 8, wherein the metal particle comprises a nano-metal particle.

11. The manufacturing method of claim 8, wherein the ion compound comprises CuCl$_2$, Cu(NO$_3$)$_2$, CuSO$_4$, Cu(OAc)$_2$, AgCl, AgNO$_3$, Ag$_2$SO$_4$, Ag(OAc), Pd(OAc), PdCl$_2$, Pd(NO$_3$)$_2$, PdSO$_4$, Pd(OAc)$_2$, FeCl$_2$, Fe(NO$_3$)$_2$, FeSO$_4$, or [Fe$_3$O(OAc)$_6$(H$_2$O)$_3$]OAc.

12. The manufacturing method of claim 1, wherein the second catalyzer comprises an organometallic compound, an ion compound, a metal chelate compound, or a semiconductor material with a band gap greater than or equal to 3 eV.

13. The manufacturing method of claim 12, wherein the ion compound comprises $CuCl_2$, $Cu(NO_3)_2$, $CuSO_4$, $Cu(OAc)_2$, $AgCl$, $AgNO_3$, $Ag_2SO_4$, $Ag(OAc)$, $Pd(OAc)$, $PdCl_2$, $Pd(NO_3)_2$, $PdSO_4$, $Pd(OAc)_2$, $FeCl_2$, $Fe(NO_3)_2$, $FeSO_4$, or $[Fe_3O(OAc)_6(H_2O)_3]OAc$.

14. The manufacturing method of claim 12, wherein the semiconductor material is one selected from the group consisting of gallium nitride, zinc sulfide, silicon carbide, zinc oxide, titanium dioxide, aluminum gallium nitride, aluminum nitride, aluminum oxide, boron nitride, silicon nitride, silicon dioxide, and combinations thereof.

15. The manufacturing method of claim 12, wherein a structure of the organometallic compound is R-M-R' or R-M-X, wherein R and R' individually represent an alkyl group, aromatic hydrocarbon, cycloalkane, haloalkane, a heterocyclic ring, or carboxylic acid; M is one selected from the group consisting of silver, palladium, copper, gold, tin, aluminum, nickel, iron and combinations thereof; and X is a halogen compound or an amine.

16. The manufacturing method of claim 15, wherein a carbon number of at least one of R and R' in the structure of the organometallic compound is greater than or equal to 3.

17. The manufacturing method of claim 12, wherein the metal chelate compound is made by chelating a metal with a chelating agent, and the chelating agent is ammonium pyrrolidine dithiocarbamate, ehtylenediaminetetraacetic acid, N,N'-bis(carboxymethyl) nitrilotriacetate acid, or diethylenetriamine pentaacetic acid.

18. The manufacturing method of claim 17, wherein the metal is one selected from the group consisting of silver, palladium, copper, gold, tin, aluminum, nickel, iron, and combinations thereof.

19. The manufacturing method of claim 1, wherein the insulation colloid comprises polyphenylene oxide, bismaleimide triazine, cyclo olefin copolymer, liquid crystal polymer, or epoxy resin.

20. The manufacturing method of claim 1, wherein a method of forming the insulation colloidal layer comprises coating, spray coating, or blade coating.

21. The manufacturing method of claim 1, wherein a wavelength of the laser is between 200 nm and 1100 nm.

22. The manufacturing method of claim 1, further comprising repeating the step of forming the wiring layer and the step of forming the conductive via.

23. A multilayer wiring structure comprising:
a substrate;
a wiring layer located on the substrate, the wiring layer comprises a patterned colloidal layer and a conductive layer, an intersection is between the patterned colloidal layer and the conductive layer, wherein the patterned colloidal layer comprises 60-90 wt % of a polymer material and 10-40 wt % of a first catalyzer;
an insulation colloidal layer covering the substrate and the wiring layer, the insulation colloidal layer comprising an insulation colloid and a second catalyzer, the second catalyzer accounting for 0.1-10 wt % of the insulation colloidal layer; and
at least one conductive via formed in the insulation colloidal layer and electrically connected to the conductive layer.

24. The multilayer wiring structure of claim 23, wherein a line width of the patterned colloidal layer is less than or equal to 30 micrometers.

25. The multilayer wiring structure of claim 23, wherein a thickness of the patterned colloidal layer is less than or equal to 3 micrometers.

26. The multilayer wiring structure of claim 23, wherein the intersection is substantially parallel to a surface of the substrate.

27. The multilayer wiring structure of claim 23, wherein the polymer material comprises an acrylic material, epoxy resin, phenol resin, or a mixture thereof.

28. The multilayer wiring structure of claim 23, wherein the insulation colloid comprises polyphenylene oxide, bismaleimide triazine, cyclo olefin copolymer, liquid crystal polymer, or epoxy resin.

29. The multilayer wiring structure of claim 23, wherein the first catalyzer comprises an ion compound, a metal particle, or a mixture thereof.

30. The multilayer wiring structure of claim 29, wherein the metal particle comprises a copper particle, a silver particle, or a palladium particle.

31. The multilayer wiring structure of claim 29, wherein the metal particle comprises a nano-metal particle.

32. The multilayer wiring structure of claim 29, wherein the ion compound comprises $CuCl_2$, $Cu(NO_3)_2$, $CuSO_4$, $Cu(OAc)_2$, $AgCl$, $AgNO_3$, $Ag_2SO_4$, $Ag(OAc)$, $Pd(OAc)$, $PdCl_2$, $Pd(NO_3)_2$, $PdSO_4$, $Pd(OAc)_2$, $FeCl_2$, $Fe(NO_3)_2$, $FeSO_4$, or $[Fe_3O(OAc)_6(H_2O)_3]OAc$.

33. The multilayer wiring structure of claim 23, wherein the second catalyzer comprises an organometallic compound, an ion compound, a metal chelate compound, or a semiconductor material with a band gap greater than or equal to 3 eV.

34. The multilayer wiring structure of claim 33, wherein the ion compound comprises $CuCl_2$, $Cu(NO_3)_2$, $CuSO_4$, $Cu(OAc)_2$, $AgCl$, $AgNO_3$, $Ag_2SO_4$, $Ag(OAc)$, $Pd(OAc)$, $PdCl_2$, $Pd(NO_3)_2$, $PdSO_4$, $Pd(OAc)_2$, $FeCl_2$, $Fe(NO_3)_2$, $FeSO_4$, or $[Fe_3O(OAc)_6(H_2O)_3]OAc$.

35. The multilayer wiring structure of claim 33, wherein the semiconductor material is one selected from the group consisting of gallium nitride, zinc sulfide, silicon carbide, zinc oxide, titanium dioxide, aluminum gallium nitride, aluminum nitride, aluminum oxide, boron nitride, silicon nitride, silicon dioxide, and combinations thereof.

36. The multilayer wiring structure of claim 33, wherein a structure of the organometallic compound includes R-M-R' or R-M-X, wherein R and R' individually represent an alkyl group, aromatic hydrocarbon, cycloalkane, haloalkane, a heterocyclic ring, or carboxylic acid; M is one selected from the group consisting of silver, palladium, copper, gold, tin, aluminum, nickel, iron, and combinations thereof; and X is a halogen compound or an amine.

37. The multilayer wiring structure of claim 36, wherein a carbon number of at least one of R and R' in the structure of the organometallic compound is greater than or equal to 3.

38. The multilayer wiring structure of claim 33, wherein the metal chelate compound is made by chelating a metal with a chelating agent, and the chelating agent is ammonium pyrrolidine dithiocarbamate, ehtylenediaminetetraacetic acid, N,N'-bis(carboxymethyl) nitrilotriacetate acid, or diethylenetriamine pentaacetic acid.

39. The multilayer wiring structure of claim 38, wherein the metal is one selected from the group consisting of silver, palladium, copper, gold, tin, aluminum, nickel, iron, and combinations thereof.

* * * * *